(12) United States Patent
Cho et al.

(10) Patent No.: US 12,446,163 B2
(45) Date of Patent: Oct. 14, 2025

(54) PRINTED CIRCUIT BOARD AND METHOD FOR MANUFACTURING THE SAME

(71) Applicant: SAMSUNG ELECTRO-MECHANICS CO., LTD., Suwon-si (KR)

(72) Inventors: Mo Ses Cho, Suwon-si (KR); Chang Gun Oh, Suwon-si (KR); Je Sang Park, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 201 days.

(21) Appl. No.: 17/899,989

(22) Filed: Aug. 31, 2022

(65) Prior Publication Data

US 2023/0199975 A1 Jun. 22, 2023

(30) Foreign Application Priority Data

Dec. 16, 2021 (KR) .......................... 10-2021-0180525

(51) Int. Cl.
*H05K 1/11* (2006.01)
*H05K 3/46* (2006.01)

(52) U.S. Cl.
CPC .......... *H05K 3/4644* (2013.01); *H05K 1/115* (2013.01)

(58) Field of Classification Search
CPC ........ H05K 1/115; H05K 1/0242; H05K 1/11; H05K 1/09; H05K 1/111
See application file for complete search history.

(56) References Cited

U.S. PATENT DOCUMENTS

| 2003/0005582 | A1* | 1/2003 | Tatoh | H05K 3/062 |
| | | | | 174/250 |
| 2008/0308307 | A1* | 12/2008 | Chang | H05K 3/108 |
| | | | | 174/257 |
| 2010/0126758 | A1 | 5/2010 | Akai et al. | |
| 2010/0206618 | A1* | 8/2010 | Wang | H05K 3/4007 |
| | | | | 205/183 |
| 2017/0354030 | A1* | 12/2017 | Ho | H05K 3/108 |
| 2018/0279472 | A1* | 9/2018 | Sunohara | H05K 1/115 |
| 2019/0103288 | A1* | 4/2019 | Cho | H01L 23/49866 |

FOREIGN PATENT DOCUMENTS

| JP | 2005-317566 A | 11/2005 |
| KR | 10-2017-0032945 A | 3/2017 |
| KR | 10-2021-0024870 A | 3/2021 |
| WO | 2010/038531 A1 | 4/2010 |

OTHER PUBLICATIONS

Office Action issued in corresponding Korean Patent Application No. 10-2021-0180525 dated Aug. 20, 2025, with English translation.

* cited by examiner

*Primary Examiner* — Roshn K Varghese
(74) *Attorney, Agent, or Firm* — MORGAN, LEWIS & BOCKIUS LLP (57) ABSTRACT

A printed circuit board includes: a first insulating layer; a circuit pattern protruding from an upper surface of the first insulating layer and having recesses in side surfaces thereof; and a metal portion covering an upper surface and each of both side surfaces of the circuit pattern. The first insulating layer is spaced apart from at least a portion of a lower surface of the circuit pattern.

16 Claims, 7 Drawing Sheets

PRINTED CIRCUIT BOARD AND METHOD FOR MANUFACTURING THE SAME

CROSS-REFERENCE TO RELATED APPLICATION(S)

This application claims benefit of priority to Korean Patent Application No. 10-2021-0180525 filed on Dec. 16, 2021 in the Korean Intellectual Property Office, the disclosure of which is incorporated herein by reference in its entirety.

TECHNICAL FIELD

The present disclosure relates to a printed circuit board and a method for manufacturing a printed circuit board.

BACKGROUND

Concomitant with development of semiconductors and electronic devices, a printed circuit board has taken up a firm position as an electronic component, and may be widely used as a component realizing a circuit for all electrical and electronic devices from various electric and electronic products such as radios, televisions, and PCSs to computers and high-tech electronic equipment.

In order to follow the recent trend of mobile devices for weight reduction and reductions, there has also been a growing need for making a printed circuit board mounted therein lighter, thinner, shorter, and smaller.

In particular, as electronic products are small-sized and system circuits are integrated, signal throughput and signal matching in the circuit board are emerging as important topics. Especially, in a semiconductor package substrate having a complex function, such as a system-in-package (SIP), characteristics in a radio frequency (RF) frequency band are important factors influencing the function and performance of the circuit.

SUMMARY

An aspect of the present disclosure may provide a printed circuit board including a fine circuit and/or a fine via.

Another aspect of the present disclosure may provide a printed circuit board having an improved electrical signal transmission speed.

According to an aspect of the present disclosure, a printed circuit board may include: a first insulating layer; a circuit pattern protruding from an upper surface of the first insulating layer and having recesses formed in side surfaces thereof; and a metal portion covering an upper surface and each of both side surfaces of the circuit pattern, wherein the first insulating layer is spaced apart from at least a portion of a lower surface of the circuit pattern.

According to another aspect of the present disclosure, a method for manufacturing a printed circuit board may include disposing at least one first photosensitive material and at least one second photosensitive material on one surface of a first insulating layer on which a seed layer is disposed; forming a circuit pattern on the one surface of the first insulating layer in a region where the first and second photosensitive materials are not disposed; removing the first photosensitive material; forming a metal portion covering the circuit pattern; removing the second photosensitive material; and partially removing the seed layer.

According to another aspect of the present disclosure, a printed circuit board may include a first insulating layer; a circuit pattern disposed on the first insulating layer; and a metal portion including a metal different from that of the circuit pattern and covering an upper surface and a side surface of the circuit pattern. The metal portion may be spaced apart from the first insulating layer.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments of the present disclosure will now be described in detail with reference to the accompanying drawings.

Electronic Device

Figure 1:
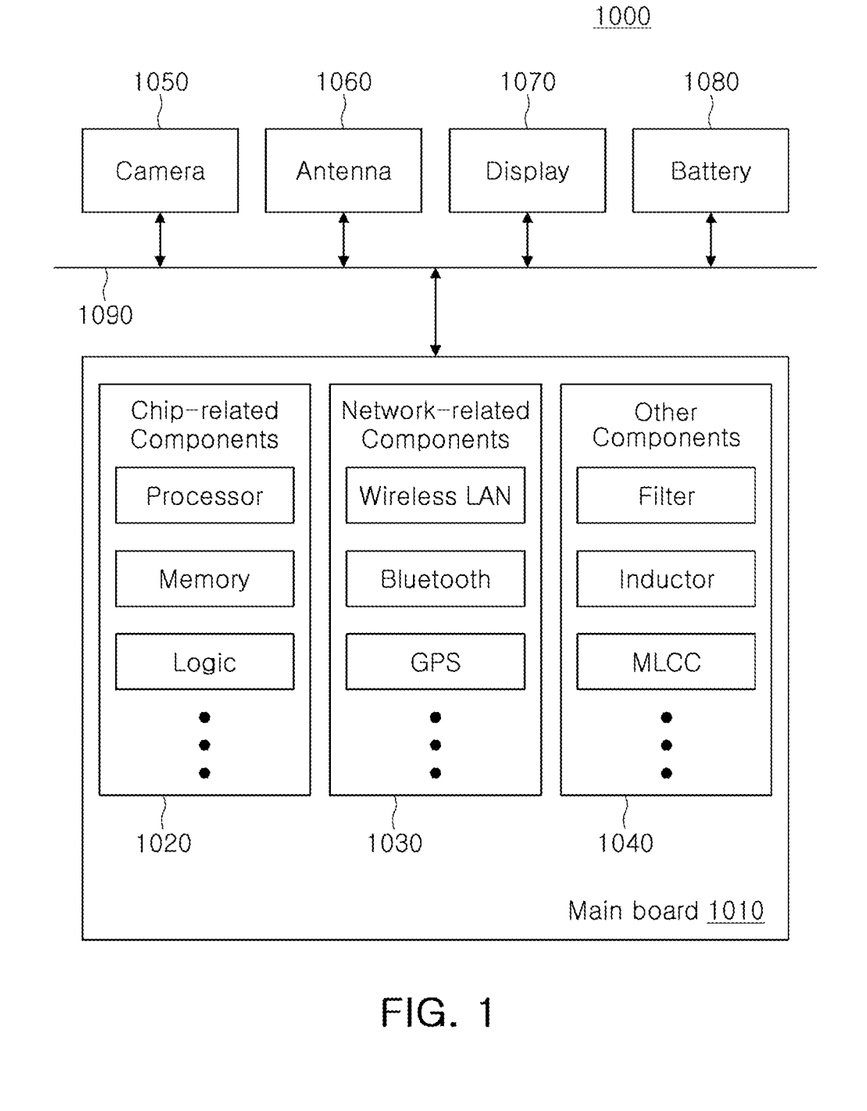
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip-related components 1020, network-related components 1030, and other components 1040, which are physically and/or electrically connected thereto. These components may be connected to other electronic components to be described below to form various signal lines 1090.

The chip-related components 1020 may include a memory chip such as a volatile memory (e.g., a dynamic random access memory (DRAM)), a non-volatile memory (e.g., a read only memory (ROM)), or a flash memory; an application processor chip such as a central processor (e.g., a central processing unit (CPU)), a graphics processor (e.g., a graphics processing unit (GPU)), a digital signal processor, a cryptographic processor, a microprocessor, or a microcontroller; and a logic chip such as an analog-digital converter or an application-specific integrated circuit (ASIC). The chip-related components 1020 are not limited thereto, but may also include other types of chip-related electronic components. In addition, these electronic components 1020 may be combined with each other. The chip-related components 1020 may be in the form of a package including the chips or electronic components described above.

The network-related components 1030 may include protocols such as wireless fidelity (Wi-Fi) (Institute of Electrical and Electronics Engineers (IEEE) 802.11 family or the like), worldwide interoperability for microwave access (WiMAX) (IEEE 802.16 family or the like), IEEE 802.20, long term evolution (LTE), evolution data only (Ev-DO), high speed packet access+(HSPA+), high speed downlink packet access+(HSDPA+), high speed uplink packet access+ (HSUPA+), global system for mobile communications (GSM), enhanced data GSM environment (EDGE), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network-related components 1030 are not limited thereto, but may also include a variety of other wireless or wired standards or protocols. In addition, the network-related components 1030 may be combined with each other, together with the chip-related electronic components 1020.

The other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, the other components 1040 are not limited thereto, but also include passive elements in chip component type used for various other purposes, and the like. In addition, the other components 1040 may be combined with each other, together with the chip-related electronic components 1020 and/or the network-related electronic components 1030.

Depending on the type of electronic device 1000, the electronic device 1000 may include other electronic components that may or may not be physically and/or electrically connected to the mainboard 1010. Examples of the other electronic components may include a camera 1050, an antenna 1060, a display 1070, a battery 1080, and the like. The other electronic components are not limited thereto, but may be an audio codec, a video codec, a power amplifier, a compass, an accelerometer, a gyroscope, a speaker, a mass storage unit (e.g., a hard disk drive), a compact disk (CD), a digital versatile disk (DVD), and the like. The other electronic components may also include other electronic components and the like used for various purposes depending on the type of electronic device 1000.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
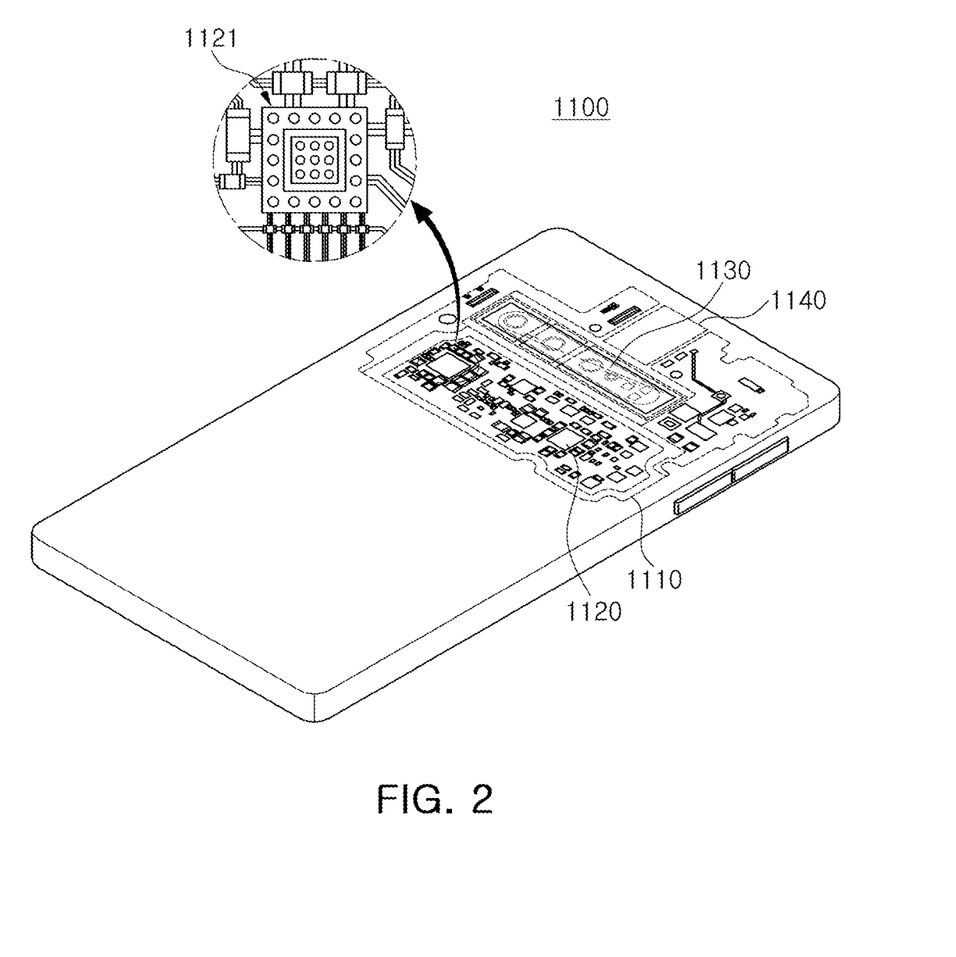
FIG. 2 is a schematic perspective view illustrating an example of an electronic device.

FIG. 2 is a schematic perspective view illustrating an example of an electronic device.

Referring to FIG. 2, the electronic device may be, for example, a smartphone 1100. A mainboard 1110 may be accommodated in the smartphone 1100, and various electronic components 1120 may be physically and/or electrically connected to the mainboard 1110. In addition, other electronic components that may or may not be physically and/or electrically connected to the mainboard 1110, such as a camera module 1130 and/or a speaker 1140, may also be accommodated therein. Some of the electronic components 1120 may be the above-described chip-related components, e.g., an antenna module 1121, but are not limited thereto. The antenna module 1121 may be in such a form that the electronic component is surface-mounted on a printed circuit board, but is not limited thereto. Meanwhile, the electronic device is not necessarily limited to the smartphone 1100, but may be any other electronic device as described above.

Printed Circuit Board

Figure 3:
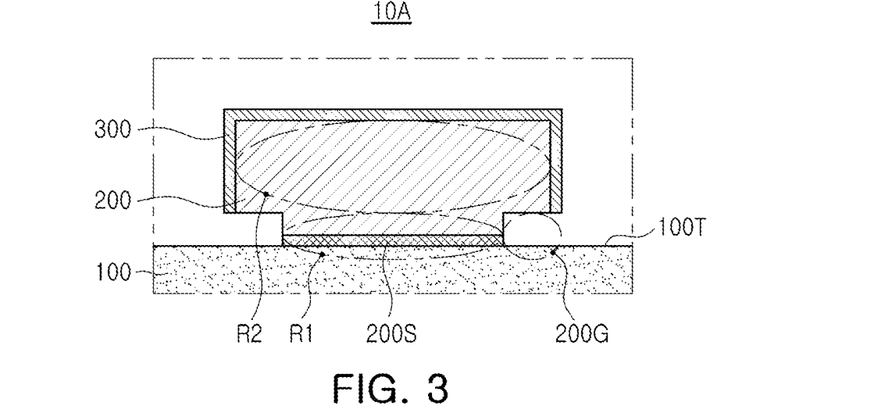
FIG. 3 is a schematic view illustrating a printed circuit board according to an exemplary embodiment of the present disclosure.

FIG. 3 is a schematic view illustrating a printed circuit board 10A according to an exemplary embodiment of the present disclosure.

Referring to FIG. 3, the printed circuit board 10A according to the present disclosure may include a first insulating layer 100, a circuit pattern 200 protruding from an upper surface 100T of the first insulating layer 100 and having recesses 200G formed in side surfaces thereof, and a metal portion 300 covering an upper surface and each of both side surfaces of the circuit pattern 200.

In this case, a lower surface of the circuit pattern 200 may be at least partially spaced apart from the first insulating layer 100. That is, the first insulating layer 100 may be partially exposed by the recesses 200G in the side surfaces of the circuit pattern 200 in a region corresponding to the lower surface of the circuit pattern 200, and the recesses 200G may be formed in both side surfaces of the circuit pattern 200, respectively, but are not limited thereto.

In addition, a seed layer 200S contacting the first insulating layer 100 may be further disposed on the lower surface of the circuit pattern 200. The seed layer 200S may serve as a known seed layer, and may refer to a copper foil or an electroless plating layer, but is not limited thereto.

In addition, the metal portion 300 disposed on the upper surface and each of both side surfaces of the circuit pattern 200 may be integrally formed. That is, the metal portion 300 may cover the upper surface and both side sides of the circuit pattern 200 in a lump to be spaced apart from the first insulating layer 100, but is not limited thereto.

In the printed circuit board 10A according to the present disclosure, the circuit pattern 200 may include a first region R1 close to the first insulating layer 100 and a second region R2 excluding the first region R1. In this case, the second region R2 may be formed to have a larger diameter or cross-sectional area than the first region R1 in the circuit pattern 200.

In addition, the diameter or cross-sectional area of the first region R1 of the circuit pattern 200 may be equal or uniform in a thickness or stacking direction.

In the printed circuit board 10A according to the present disclosure, the first insulating layer 100 and the metal portion 300 may be spaced apart from each other. That is, the metal portion 300 may be disposed in a position spaced apart from the first insulating layer 100 by a predetermined distance based on the recesses 200G of the circuit pattern 200, but is not limited thereto.

In particular, the metal portion 300 covering the circuit pattern 200 may include a metal material different from that of the circuit pattern 200. More specifically, it is preferable that the circuit pattern 200 includes copper (Cu) and the metal portion 300 includes silver (Ag), but the metal materials of the circuit pattern 200 and the metal portion 300 are not limited thereto.

By disposing the metal portion 300 including silver (Ag) around the circuit pattern 200 that transmits a signal, it is possible to decrease resistance and increase electrical conductivity, resulting in an improvement in signal transmission performance.

The first insulating layer 100 of the printed circuit board 10A according to the present disclosure may include a known insulating material, but is not limited thereto. More specifically, the first insulating layer 100 may be formed by using at least one of a thermosetting resin such as an epoxy resin, a thermoplastic resin such as a polyimide resin, and a resin in which the thermosetting or thermoplastic resin is impregnated together with an inorganic filler in a core material such as a glass fiber (glass cloth or glass fabric), for example, prepreg, Ajinomoto build-up film (ABF), FR-4, or bismaleimide triazine (BT).

In addition, the circuit pattern 200 may be formed using a conductive material such as copper (Cu), aluminum (Al), silver (Ag), tin (Sn), gold (Au), nickel (Ni), lead (Pb), titanium (Ti), palladium (Pd), or an alloy thereof, but is not limited thereto.

In particular, the metal portion 300 covering the circuit pattern 200 may include a metal material different from that of the circuit pattern 200. More specifically, it is preferable that the circuit pattern 200 include copper (Cu) and the metal portion 300 include silver (Ag), but the metal materials of the circuit pattern 200 and the metal portion 300 are not limited thereto.

By disposing the metal portion 300 including silver (Ag) around the circuit pattern 200 that transmits a signal, it is possible to decrease resistance and increase electrical conductivity, resulting in an improvement in signal transmission performance.

In addition, the circuit pattern 200 of the printed circuit board 10A according to the present disclosure may include an electroless plating layer and an electrolytic plating layer. The electroless plating layer may serve as a seed layer for the electrolytic plating layer, but is not limited thereto. In this case, the electroless plating layer may be the seed layer 200S on the upper surface 100T of the first insulating layer 100.

In addition, the electroless plating layer and the electrolytic plating layer filling the circuit pattern 200 may also include copper (Cu), aluminum (Al), silver (Ag), tin (Sn), gold (Au), nickel (Ni), lead (Pb), titanium (Ti), palladium (Pd), or an alloy thereof.

Figure 4:
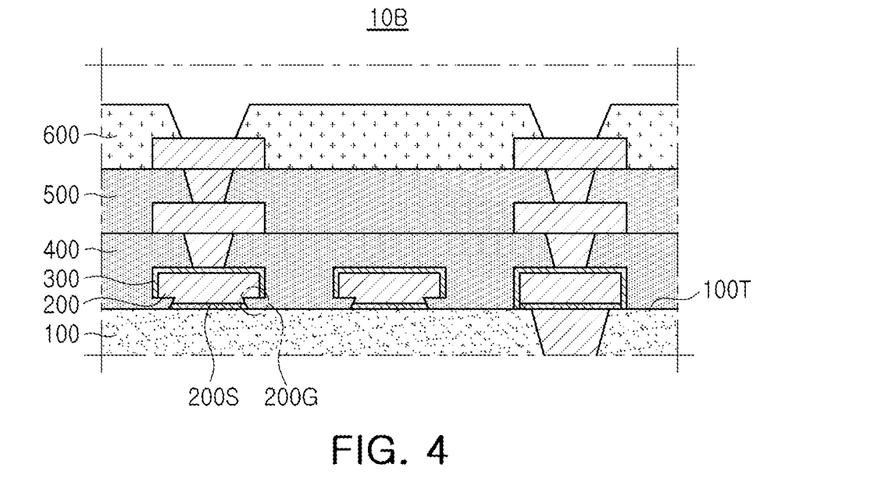
FIG. 4 is a schematic view illustrating a printed circuit board according to another exemplary embodiment of the present disclosure.

FIG. 4 is a schematic view illustrating a printed circuit board 10B according to another exemplary embodiment of the present disclosure.

Referring to the drawings, FIG. 4 may correspond to an exemplary embodiment to which the printed circuit board 10A according to FIG. 3 is applied.

The printed circuit board 10B according to the present disclosure may include a first insulating layer 100, a circuit pattern 200 protruding from an upper surface 100T of the first insulating layer 100 and having recesses 200G formed in side surfaces thereof, and a metal portion 300 covering an upper surface and each of both side surfaces of the circuit pattern 200.

In this case, a lower surface of the circuit pattern 200 may be at least partially spaced apart from the first insulating layer 100. That is, the first insulating layer 100 may be partially exposed by the recesses 200G in the side surfaces of the circuit pattern 200 in a region corresponding to the lower surface of the circuit pattern 200, and the recesses 200G may be formed in both side surfaces of the circuit pattern 200, respectively, but are not limited thereto.

In the printed circuit board 10B according to the present disclosure, the circuit pattern 200 may include a first region R1 (referring to FIG. 3) close to the first insulating layer 100 and a second region R2 (referring to FIG. 3) excluding the first region R1. In this case, the second region R2 may be formed to have a larger diameter or cross-sectional area than the first region R1 in the circuit pattern 200.

In addition, the diameter or cross-sectional area of the first region R1 of the circuit pattern 200 may be equal or uniform in a thickness or stacking direction.

Alternatively, the first region R1 of the circuit pattern 200 may have a largest cross-sectional area in a portion closest to the first insulating layer 100, but is not limited thereto.

In the printed circuit board 10B according to the present disclosure, the first insulating layer 100 and the metal portion 300 may be spaced apart from each other. That is, the metal portion 300 may be disposed in a position spaced apart from the first insulating layer 100 by a predetermined distance based on the recesses 200G of the circuit pattern 200, but is not limited thereto. Meanwhile, as illustrated in FIG. 4, in a case where a circuit pattern is connected to a via penetrating through the first insulating layer 100, the circuit pattern may not include recesses 200G, and in this case, at least a portion of the metal portion 300 may contact the first insulating layer 100, but the circuit pattern is not limited thereto.

In particular, the metal portion 300 covering the circuit pattern 200 may include a metal material different from that of the circuit pattern 200. More specifically, it is preferable that the circuit pattern 200 includes copper (Cu) and the metal portion 300 includes silver (Ag), but the metal materials of the circuit pattern 200 and the metal portion 300 are not limited thereto.

By disposing the metal portion 300 including silver (Ag) around the circuit pattern 200 that transmits a signal, it is possible to decrease resistance and increase electrical conductivity, resulting in an improvement in signal transmission performance.

The printed circuit board 10B according to the present disclosure may further include a via penetrating through the first insulating layer 100. In this case, the via may be connected to a circuit layer disposed on the upper surface 100T of the first insulating layer. In addition, the printed circuit board 10B according to the present disclosure may further include a second insulating layer 400 disposed on the upper surface 100T of the first insulating layer 100 to cover each of the circuit pattern 200 and the metal portion 300. In this case, a circuit layer may be further disposed on an upper surface of the second insulating layer 400, and a via penetrating through the second insulating layer 400 may be formed to connect the circuit layer on the upper surface of the second insulating layer 400 to the circuit layer on the upper surface of the first insulating layer 100, but is not limited thereto.

In this case, the circuit layer disposed on the upper surface of the second insulating layer 400 may not include a metal portion 300 in the printed circuit board 10B according to the present disclosure. That is, by forming a metal portion 300 only on a specific or designated circuit layer, it is possible to improve signal transmission performance and shorten a processing time.

In addition, the printed circuit board 10B according to the present disclosure may include one or more build-up layers 500 disposed on the upper surface of the second insulating layer 400, and the build-up layer 500 may include an insulating layer, a circuit layer, and a via. In addition, a solder resist layer 600 may be further disposed on an outermost one of the build-up layers 500. The solder resist layer 600 may expose an outermost circuit layer, and the exposed outermost circuit layer may include a connection pad connected to an electronic component, but is not limited thereto.

In addition, although not illustrated, in the printed circuit board 10B according to the present disclosure, a solder connected to the connection pad may be further disposed to connect the connection pad to an external electronic component or a semiconductor substrate.

In addition, although not illustrated, the printed circuit board 10B according to the present disclosure may further include an electronic component connected to the connection pad exposed from the solder resist layer 600. In this case, the electronic component may be a passive electronic component, an active electronic component, a semiconductor die, a chip electronic component, or the like, but is not limited thereto. That is, the electronic component may refer to a known component as long as it is an electronic component that is mountable on the printed circuit board.

In addition, the circuit layer of the build-up layer 500 may not include a metal portion 300 in the printed circuit board 10B according to the present disclosure. That is, by forming a metal portion 300 only on a specific or designated circuit layer as described above, it is possible to improve signal transmission performance and shorten a processing time.

Each of the first and second insulating layers 100 and 400 and the build-up insulating layer of the printed circuit board 10B according to the present disclosure may include a known insulating material, but is not limited thereto. More specifically, the first and second insulating layers 100 and 400 may be formed by using at least one of a thermosetting resin such as an epoxy resin, a thermoplastic resin such as a polyimide resin, and a resin in which the thermosetting or thermoplastic resin is impregnated together with an inorganic filler in a core material such as a glass fiber (glass cloth or glass fabric), for example, prepreg, Ajinomoto build-up film (ABF), FR-4, or bismaleimide triazine (BT).

In addition, each of the circuit pattern 200, the via, and the build-up circuit layer may be formed using a conductive material such as copper (Cu), aluminum (Al), silver (Ag), tin (Sn), gold (Au), nickel (Ni), lead (Pb), titanium (Ti), palladium (Pd), or an alloy thereof, but is not limited thereto.

In particular, the metal portion 300 covering the circuit pattern 200 may include a metal material different from that of the circuit pattern 200. More specifically, it is preferable that the circuit pattern 200 includes copper (Cu) and the metal portion 300 includes silver (Ag), but the metal materials of the circuit pattern 200 and the metal portion 300 are not limited thereto.

By disposing the metal portion 300 including silver (Ag) around the circuit pattern 200 that transmits a signal, it is possible to decrease resistance and increase electrical conductivity, resulting in an improvement in signal transmission performance.

In addition, each of the circuit pattern 200, the via, and the build-up circuit layer of the printed circuit board 10B according to the present disclosure may include an electroless plating layer and an electrolytic plating layer. The electroless plating layer may serve as a seed layer for the electrolytic plating layer, but is not limited thereto.

In this case, the electroless plating layer and the electrolytic plating layer filling each of the circuit pattern 200 and the via may also include copper (Cu), aluminum (Al), silver (Ag), tin (Sn), gold (Au), nickel (Ni), lead (Pb), titanium (Ti), palladium (Pd), or an alloy thereof.

The circuit layer disposed in the outermost one of the build-up layers 500 of the printed circuit board 10B according to the present disclosure may include a connection pad. In this case, although not illustrated, the connection pad may include a surface treatment layer, and the surface treatment layer may include a different composition from the circuit layer. For example, each of the circuit layers may include copper (Cu), and the surface treatment layer may include nickel (Ni) or tin (Sn), but the circuit layer and the surface treatment layer are not limited thereto.

In addition, the printed circuit board 10B according to the present disclosure may include a solder resist layer 600 on one surface of the insulating layer disposed in the outermost one of the build-up layers 500 to cover at least a portion of the circuit layer including the connection pad on which the surface treatment layer is disposed.

The solder resist layer 600 may have thermosetting and/or photocurable properties, but is not limited thereto.

Concerning the other components, what has been described above is substantially identically applicable, and thus, the detailed description thereof will not be repeated.

Method for Manufacturing Printed Circuit Board

FIGS. 5A to 5G are schematic views illustrating a method for manufacturing a printed circuit board according to an exemplary embodiment of the present disclosure.

A method for manufacturing a printed circuit board according to the present disclosure will be described below with reference to FIGS. 5A to 5G.

Figure 5A:
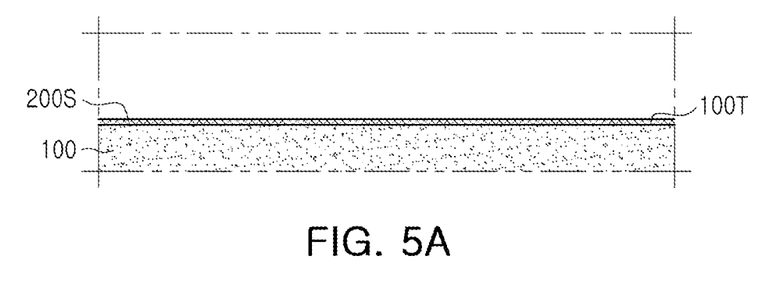
FIGS. 5A to 5G are schematic views illustrating a method for manufacturing a printed circuit board according to an exemplary embodiment of the present disclosure.

First, as illustrated in FIG. 5A, a first insulating layer 100 provided with a copper foil or a seed layer 200S disposed entirely on one surface thereof may be prepared. In this case, the first insulating layer 100 may be a known copper clad laminate (CCL), or may be an insulating layer on which a metal layer including copper (Cu) is disposed, but is not limited thereto. That is, the first insulating layer may be a known insulating layer provided with a metal layer disposed on one surface thereof.

Figure 5B:
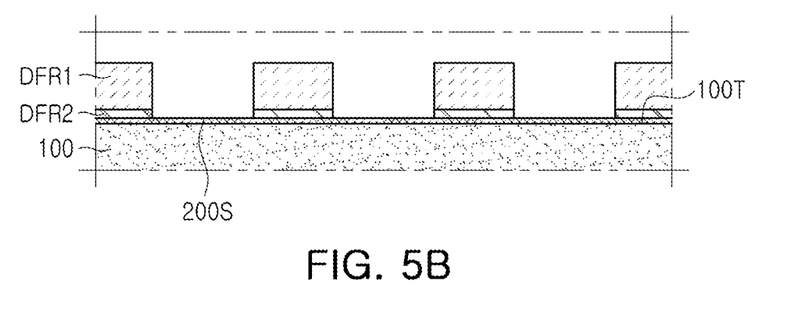

Thereafter, as illustrated in FIG. 5B, each of first and second photosensitive materials DFR1 and DFR2 having different reactivities may be disposed on one surface of the first insulating layer 100. In this case, in a case where a copper foil or a seed layer 200S is disposed on an upper surface 100T of the first insulating layer 100 as illustrated, each of the first and second photosensitive materials DFR1 and DFR2 may be disposed on an upper surface of the seed layer 200S.

That is, one surface of the first insulating layer may refer to the upper surface of the first insulating layer 100 or the upper surface of the seed layer 200S according to circumstances, but is not limited thereto.

In addition, the first and second photosensitive materials may include known materials, and may have different reactivities from each other so that a circuit pattern 200 and a metal portion 300, which will be described below, are formed through plating in a more efficient way, but are not limited thereto.

In the method for manufacturing a printed circuit board according to the present disclosure, the disposing of at least one first photosensitive material DFR1 and at least one second photosensitive material DFR2 on one surface of the first insulating layer 100 may include stacking the first and second photosensitive materials DFR1 and DFR2 independently from each other. More specifically, after stacking the second photosensitive material DFR2 partially on one surface of the first insulating layer 100, the first photosensitive material DFR1 may be stacked on one surface of the second photosensitive material DFR2.

Unlike the conventional method in which plating is performed using a single photosensitive material, the printed circuit board according to the present disclosure uses a plurality of photosensitive materials having different reactivities to perform plating for forming the metal portion 300 covering the circuit pattern 200 in a more effective way. In addition, by disposing the metal portion 300 including silver (Ag) around the circuit pattern 200 that transmits a signal, it is possible to decrease resistance and increase electrical conductivity, resulting in an improvement in signal transmission performance.

The first insulating layer 100 of the printed circuit board according to the present disclosure may be formed by using at least one of a thermosetting resin such as an epoxy resin, a thermoplastic resin such as a polyimide resin, and a resin in which the thermosetting or thermoplastic resin is impregnated together with an inorganic filler in a core material such as a glass fiber (glass cloth or glass fabric), for example, prepreg, Ajinomoto build-up film (ABF), FR-4, or bismaleimide triazine (BT).

Figure 5C:
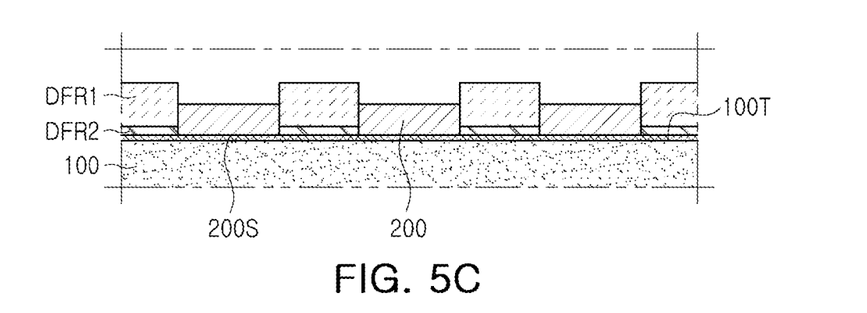

Thereafter, as illustrated in FIG. 5C, a circuit pattern 200 may be formed on one surface of the first insulating layer 100 or the seed layer 200S in a region where the first and second photosensitive materials DFR1 and DFR2 are not stacked.

The circuit pattern 200 may be formed by a metal plating method, but is not limited thereto, and may be formed using any known patterning method.

In a case where the circuit pattern 200 is formed by a plating method, the circuit pattern 200 may include an electroless plating layer and an electrolytic plating layer. The electroless plating layer may serve as a seed layer for the electrolytic plating layer, but is not limited thereto. In this case, the electroless plating layer may be the seed layer 200S on the upper surface 100T of the first insulating layer 100.

In addition, the electroless plating layer and the electrolytic plating layer forming the circuit pattern 200 may also include copper (Cu), aluminum (Al), silver (Ag), tin (Sn), gold (Au), nickel (Ni), lead (Pb), titanium (Ti), palladium (Pd), or an alloy thereof.

Figure 5D:
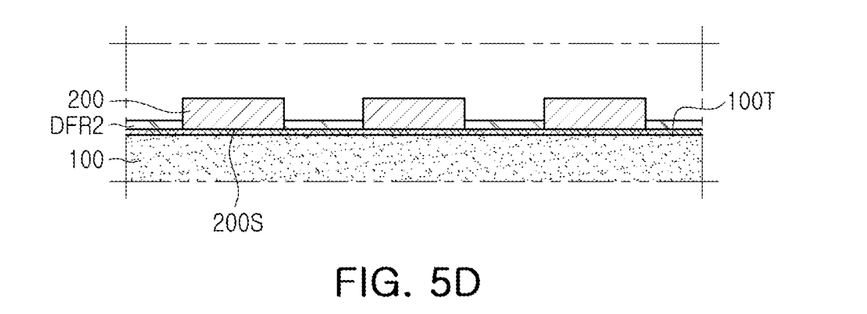

After the circuit pattern 200 is formed, the first photosensitive material DFR1 may be removed as illustrated in FIG. 5D. In this case, the second photosensitive material DFR2 may remain on one surface of the seed layer 200S.

Figure 5E:
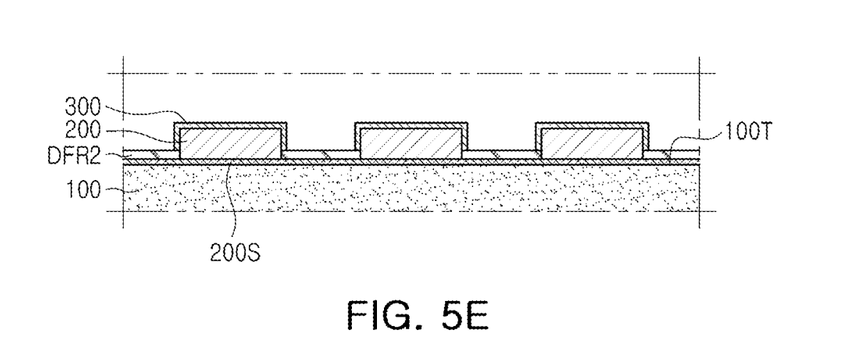

Thereafter, as illustrated in FIG. 5E, a metal portion 300 covering the circuit pattern 200 may be formed. The metal portion 300 may be disposed on an upper surface and both side surfaces of the circuit pattern 200, and the second photosensitive material DFR2 functions as a mask so that the metal portion 300 is not formed in a portion of each of both side surfaces of the circuit pattern 200.

In addition, the metal portion 300 covering the circuit pattern 200 may include a metal material different from that of the circuit pattern 200. More specifically, it is preferable that the circuit pattern 200 includes copper (Cu) and the metal portion 300 includes silver (Ag), but the metal materials of the circuit pattern 200 and the metal portion 300 are not limited thereto.

The metal portion 300 may be formed by a known metal plating method, but is not limited thereto, and may be formed using any known metal coating method.

Figure 5F:
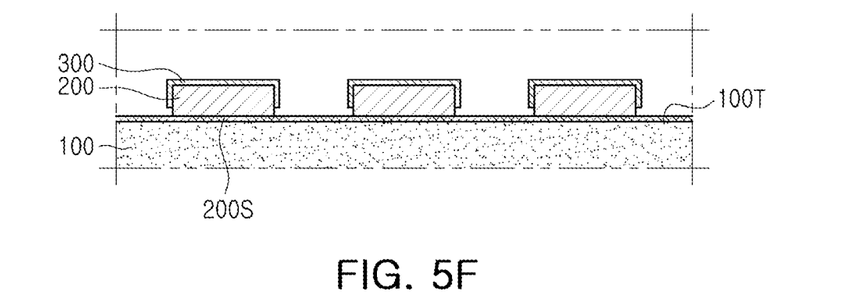

Thereafter, as illustrated in FIG. 5F, the second photosensitive material DFR2 may be removed. After the second photosensitive material DFR2 is removed, the metal portion 300 may not be disposed on a portion of each of both side surfaces of the circuit pattern 200 as described above.

Figure 5G:
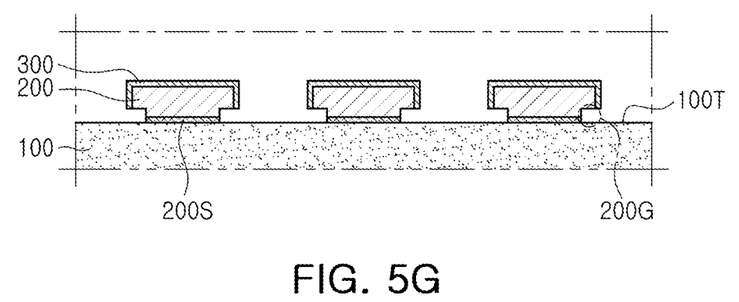

Thereafter, as illustrated in FIG. 5G, the seed layer 200S remaining on the upper surface 100T of the first insulating layer 100 may be partially removed. In this case, the seed layer 200S may be removed by an etching method or the like, but is not limited thereto, and may be removed by any known method.

In addition, the seed layer 200S may include the same metal material as the circuit pattern 200. In this case, in a process of etching the seed layer 200S, the circuit pattern 200 may partially react together. That is, at the time of removing the seed layer 200S, the circuit pattern 200 may be at least partially removed together, so that recesses 200G are formed in the side surfaces of the circuit pattern 200 as illustrated in FIG. 5G.

In addition, the first insulating layer 100 may be partially exposed by the recesses 200G in the side surfaces of the circuit pattern 200 in a region corresponding to the lower surface of the circuit pattern 200, and the recesses 200G may be formed in both side surfaces of the circuit pattern 200, respectively, but are not limited thereto.

In addition, the circuit pattern 200 may include a first region close to the first insulating layer 100 and a second region excluding the first region. In this case, the second region may be formed to have a larger diameter or cross-sectional area than the first region in the circuit pattern 200, but the circuit pattern 200 is not limited thereto. In addition, the diameter or cross-sectional area of the first region of the circuit pattern 200 may be equal or uniform in a thickness or stacking direction.

The first insulating layer 100 and the metal portion 300 may be spaced apart from each other. That is, the metal portion 300 may be disposed in a position spaced apart from the first insulating layer 100 by a predetermined distance based on the recesses 200G of the circuit pattern 200, but is not limited thereto.

By disposing the metal portion 300 including silver (Ag) around the circuit pattern 200 that transmits a signal, it is possible to decrease resistance and increase electrical conductivity, resulting in an improvement in signal transmission performance.

Concerning the other components, what has been described above is substantially identically applicable, and thus, the detailed description thereof will not be repeated.

As set forth above, as one effect of the present disclosure, it is possible to provide a printed circuit board including a fine circuit and/or a fine via.

As another effect of the present disclosure, it is possible to provide a printed circuit board having an improved electrical signal transmission speed.

While exemplary embodiments have been shown and described above, it will be apparent to those skilled in the art that modifications and variations could be made without departing from the scope of the present invention as defined by the appended claims.

What is claimed is:

1. A printed circuit board comprising:
   a first insulating layer;
   a circuit pattern protruding from an upper surface of the first insulating layer in a thickness direction and having recesses in side surfaces thereof; and
   a metal portion covering an upper surface and at least a portion of each of the side surfaces of the circuit pattern,
   wherein the recesses are thinner than a portion of the circuit pattern extending from the recesses in the thickness direction,
   wherein at least a portion of the side surfaces extend inwardly from the upper surface of the first insulating layer to a lower surface of the circuit pattern arranged between the upper surface of the circuit pattern and the at least a portion of the side surfaces in the thickness direction, and
   wherein a thickness of the at least a portion of the side surfaces is less than a thickness of a remaining portion of the circuit pattern above the lower surface of the circuit pattern.

2. The printed circuit board of claim 1, wherein the circuit pattern includes a first region and a second region, the first region disposed between the first insulating layer and the second region, and
   the second region has a larger cross-sectional area than the first region.

3. The printed circuit board of claim 2, wherein the first region of the circuit pattern has a largest cross-sectional area in a portion closest to the first insulating layer.

4. The printed circuit board of claim 1, wherein each of the side surfaces of the circuit pattern has a step.

5. The printed circuit board of claim 1, wherein the first insulating layer and the metal portion are spaced apart from each other.

6. The printed circuit board of claim 1, wherein the metal portion includes silver (Ag).

7. The printed circuit board of claim 1, further comprising a second insulating layer disposed on the upper surface of the first insulating layer to cover each of the circuit pattern and the metal portion.

8. The printed circuit board of claim 7, further comprising:
   one or more build-up layers disposed on an upper surface of the second insulating layer; and
   a solder resist layer disposed on an outermost one of the build-up layers.

9. The printed circuit board of claim 1, wherein the circuit pattern includes a seed layer contacting the first insulating layer.

10. The printed circuit board of claim 1, wherein the metal portion disposed on the upper surface and each of both side surfaces of the circuit pattern is integrally formed.

11. The printed circuit board of claim 1, wherein the metal portion continuously extends on the upper surface and each of both side surfaces of the circuit pattern.

12. A printed circuit board comprising:
   a first insulating layer;
   a circuit pattern disposed on the first insulating layer and having a recess in a side surface thereof; and
   a metal portion including a metal different from that of the circuit pattern and covering an upper surface and a side surface of the circuit pattern,
   wherein a part of the metal portion covering the side surface of the circuit pattern includes a lower portion which is spaced apart from the first insulating layer by at least a distance corresponding to a thickness of the recess,
   wherein a portion of the side surface extends inwardly from the first insulating layer to a lower surface of the circuit pattern arranged between the upper surface of the circuit pattern and the portion of the side surface in a thickness direction, and
   wherein a thickness of the portion of the side surface is less than a thickness of a remaining portion of the circuit pattern above the lower surface of the circuit pattern.

13. The printed circuit board of claim 12, wherein the circuit pattern includes a seed layer contacting the first insulating layer, and
   the metal portion is spaced apart from the seed layer.

14. The printed circuit board of claim 12, wherein the metal portion includes silver (Ag) and the circuit pattern includes copper (Cu).

15. The printed circuit board of claim 12, further comprising a second insulating layer disposed on the first insulating layer to cover each of the circuit pattern and the metal portion,
   wherein the second insulating layer includes a portion disposed between the metal portion and the first insulating layer.

16. The printed circuit board of claim 15, further comprising:
   one or more build-up layers disposed on the second insulating layer; and
   a solder resist layer disposed on an outermost one of the build-up layers.

* * * * *